United States Patent
Chen et al.

(10) Patent No.: US 12,149,160 B2
(45) Date of Patent: Nov. 19, 2024

(54) CONVERTER HAVING MULTI-STAGE HIGH-SIDE DRIVING MECHANISM

(71) Applicant: ANPEC ELECTRONICS CORPORATION, Hsinchu (TW)

(72) Inventors: Kun-Min Chen, Hsinchu (TW); Ke-Tsung Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 211 days.

(21) Appl. No.: 17/968,803

(22) Filed: Oct. 19, 2022

(65) Prior Publication Data

US 2024/0072654 A1 Feb. 29, 2024

(30) Foreign Application Priority Data

Aug. 29, 2022 (TW) .................................. 111132396

(51) Int. Cl.
*H02M 1/08* (2006.01)
*H02M 1/00* (2006.01)
*H02M 3/07* (2006.01)
*H02M 3/158* (2006.01)

(52) U.S. Cl.
CPC ........... *H02M 1/08* (2013.01); *H02M 1/0006* (2021.05); *H02M 1/0029* (2021.05); *H02M 3/07* (2013.01); *H02M 3/158* (2013.01)

(58) Field of Classification Search
CPC ........ H02M 1/08; H02M 1/0006; H02M 3/07; H02M 3/158
See application file for complete search history.

(56) References Cited

U.S. PATENT DOCUMENTS

| | | | |
|---|---|---|---|
| 2014/0253077 A1* | 9/2014 | Clavette | H02M 1/08 323/282 |
| 2020/0099367 A1* | 3/2020 | Bodano | H02M 1/08 |
| 2020/0381989 A1* | 12/2020 | Kuang | H03K 19/01714 |
| 2020/0403509 A1* | 12/2020 | Zhang | H02M 3/158 |
| 2021/0273559 A1* | 9/2021 | Sandusky | H02M 3/07 |

* cited by examiner

Primary Examiner — Alex Torres-Rivera
(74) Attorney, Agent, or Firm — Li & Cai Intellectual Property Office

(57) ABSTRACT

A power converter having a multi-stage high-side driving mechanism is provided. A control circuit outputs a first high-side control signal. A high-side driving circuit, according to the first high-side control signal and a first input voltage signal, outputs a first stage high-side driving signal to a control terminal of a high-side switch. As a result, a voltage of the control terminal of the high-side switch is pulled up to a first stage voltage from zero. Then, the control circuit outputs a second high-side control signal. A charge pump outputs a charging signal. The high-side driving circuit, according to the second high-side control signal and the charging signal, outputs a second stage high-side driving signal to the control terminal of the high-side switch. As a result, the voltage of the control terminal of the high-side switch is pulled up from the first stage voltage to a target voltage.

12 Claims, 4 Drawing Sheets

CONVERTER HAVING MULTI-STAGE HIGH-SIDE DRIVING MECHANISM

CROSS-REFERENCE TO RELATED PATENT APPLICATION

This application claims the benefit of priority to Taiwan Patent Application No. 111132396, filed on Aug. 29, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having a multi-stage high-side driving mechanism.

BACKGROUND OF THE DISCLOSURE

Power converters are used to convert input voltages and supply the converted input voltages as output voltages to other electronic devices for operations of the other electronic devices. The output voltage of the power converter depends on an on-time of a high-side switch of the power converter. The power converter often includes a charge pump configured to supply a charging voltage to the high-side switch.

However, when the high-side switch is switched from an off state to an on state, the charging voltage supplied from the charge pump to a control terminal of the high-side switch may drop significantly. As a result, the high-side switch cannot be turned on successfully. Therefore, in a conventional power converter, the charge pump includes capacitors having large capacitances configured to supply a high charging voltage to the control terminal of the high-side switch such that the high-side switch can be turned on successfully. However, the capacitors having the large capacitances occupy a large space in the conventional power converter.

SUMMARY OF THE DISCLOSURE

In response to the above-referenced technical inadequacies, the present disclosure provides a power converter having a multi-stage high-side driving mechanism. The power converter includes a high-side switch, a low-side switch, a charge pump, a control circuit, a low-side driving circuit and a high-side driving circuit. A first terminal of the high-side switch is connected to an input power source. The first terminal of the high-side switch is connected to an input power source and is configured to receive a first input voltage signal from the input power source. A first terminal of the low-side switch is connected to a second terminal of the high-side switch. A second terminal of the low-side switch is grounded. A charge pump is configured to output a charging signal. The control circuit is configured to output a first high-side control signal, a second high-side control signal and a low-side control signal. The low-side driving circuit is connected to a control terminal of the low-side switch and the control circuit. The low-side driving circuit is configured to output a low-side driving signal to the control terminal of the low-side switch, according to the low-side control signal. The high-side driving circuit is connected to a control terminal of the high-side switch, the charge pump and the control circuit. The high-side driving circuit, according to the first high-side control signal, outputs a first stage high-side driving signal to the control terminal of the high-side switch to pull up a voltage of the control terminal of the high-side switch to a first stage voltage. After the voltage of the control terminal of the high-side switch is pulled up to the first stage voltage, the high-side driving circuit, according to the second high-side control signal and the charging signal, outputs a second stage high-side driving signal to the control terminal of the high-side switch to pull up the voltage of the control terminal of the high-side switch from the first stage voltage to a target voltage.

In certain embodiments, the high-side driving circuit includes a first high-side driver and a second high-side driver. The first high-side driver is connected to the control terminal of the high-side switch and the control circuit. The first high-side driver, according to the first high-side control signal, outputs the first stage high-side driving signal to the control terminal of the high-side switch to pull up the voltage of the control terminal of the high-side switch to the first stage voltage. The second high-side driver is connected to the control terminal of the high-side switch, the charge pump and the control circuit. After the voltage of the control terminal of the high-side switch is pulled up to the first stage voltage, the high-side driving circuit, according to the second high-side control signal and the charging signal, outputs the second stage high-side driving signal to the control terminal of the high-side switch to pull up the voltage of the control terminal of the high-side switch from the first stage voltage to the target voltage.

In certain embodiments, the high-side driving circuit further includes a third high-side driver. The third high-side driver is connected to the control terminal of the high-side switch, the second terminal of the high-side switch and the control circuit. The third high-side driver, according to a third high-side control signal from the control circuit, outputs a third high-side driving signal to the control terminal and the second terminal of the high-side switch to turn off the high-side switch.

In certain embodiments, the first high-side driver is connected to the input power source. The first high-side driver is configured to receive the first input voltage signal from the input power source. When the first high-side driver receives the first high-side control signal, the first high-side driver pulls up the voltage of the control terminal of the high-side switch to the first stage voltage according to the first input voltage signal.

In certain embodiments, the charge pump is connected to the input power source. The charge pump is configured to receive the first input voltage signal from the input power source.

In certain embodiments, the first stage voltage is equal to a voltage of the first input voltage signal.

In certain embodiments, the charge pump includes a first capacitor. A first terminal of the first capacitor is connected to the input power source and configured to receive the first input voltage signal from the input power source. The first terminal of the first capacitor is further connected to the high-side driving circuit. A second terminal of the first capacitor is grounded.

In certain embodiments, the charge pump further includes a second capacitor. A first terminal of the second capacitor is connected to the input power source. The first terminal of the second capacitor is configured to receive the first input voltage signal from the input power source. A second terminal of the second capacitor is connected to the first terminal of the first capacitor.

In certain embodiments, the charge pump further includes a first switch component. A first terminal of the first switch component is connected to the input power source. The first terminal of the first switch component is configured to receive the first input voltage signal from the input power source. A second terminal of the first switch component is connected to the first terminal of the second capacitor.

In certain embodiments, the charge pump further includes a second switch component. A first terminal of the second switch component is connected to the second terminal of the second capacitor. A second terminal of the second switch component is connected to the first terminal of the first capacitor.

In certain embodiments, the charge pump further includes a third switch component. A first terminal of the third switch component is connected to the input power source. The first terminal of the third switch component is configured to receive the first input voltage signal from the input power source. A second terminal of the third switch component is connected to the second terminal of the second capacitor.

In certain embodiments, the charge pump further includes a fourth switch component. A first terminal of the fourth switch component is connected to the first terminal of the second capacitor. A second terminal of the fourth switch component is coupled to a reference voltage.

In certain embodiments, a voltage difference between the first stage voltage and the target voltage is a pulled voltage. The reference voltage is equal to a voltage of the first input voltage signal from which the pulled voltage is subtracted.

As described above, the present disclosure provides the power converter having the multi-stage high-side driving mechanism. In the power converter of the present disclosure, the high-side driving circuit pulls up the voltage of the control terminal of the high-side switch from a zero voltage to the first stage voltage by using the first input voltage signal. Then, the high-side driving circuit pulls up the voltage of the control terminal of the high-side switch from the first stage voltage to the target voltage via the charge pump. As a result, the high-side switch is turned on and driven to operate normally.

That is, the charge pump of the power converter of the present disclosure does not pull up the voltage of the control terminal of the high-side switch directly from the zero voltage to the target voltage. Therefore, the charge pump of the power converter of the present disclosure only includes the capacitors having the small capacitances, thereby efficiently reducing the space occupied by the capacitors of the charge pump in the power converter.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
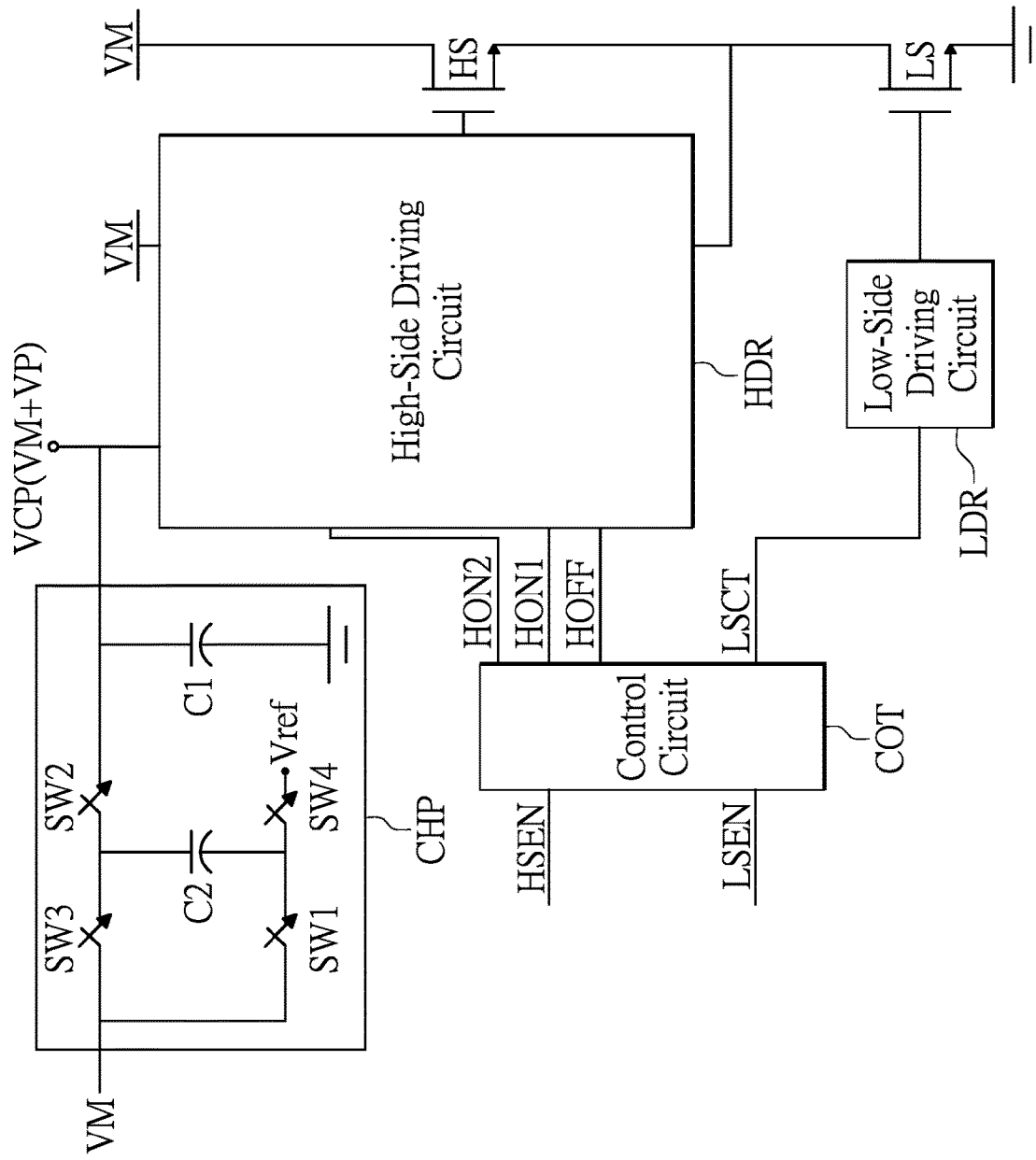
FIG. 1 is a block diagram of a power converter having a multi-stage high-side driving mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a power converter having a multi-stage high-side driving mechanism according to a first embodiment of the present disclosure.

The power converter of the embodiment of the present disclosure may include a high-side switch HS, a low-side switch LS, a charge pump CHP, a control circuit COT, a low-side driving circuit LDR and a high-side driving circuit HDR.

A first terminal of the high-side switch HS is connected to an input power source. The first terminal of the high-side switch HS receives a first input voltage signal VM from the input power source. A first terminal of the low-side switch LS is connected to a second terminal of the high-side switch HS. A second terminal of the low-side switch LS is grounded. A high-side driving circuit HDR is connected to a control terminal of the high-side switch HS, the charge pump CHP and the control circuit COT. A low-side driving circuit LDR is connected to a control terminal of the low-side switch LS and the control circuit COT.

First, the control circuit COT may output a first high-side control signal HON1 to the high-side driving circuit HDR, according to a high-side enable signal HSEN from an external enabling circuit.

The high-side driving circuit HDR may, according to the first high-side control signal HON1 from the control circuit COT (and the first input voltage signal VM from the input power source), output a first stage high-side driving signal to the control terminal of the high-side switch HS. As a result, a voltage of the control terminal of the high-side switch HS is pulled up to a first stage voltage (from a zero voltage) according to the first stage high-side driving signal. The first stage voltage is higher than the zero voltage. For example, the first stage voltage is equal to a voltage of the first input voltage signal VM.

Then, the control circuit COT outputs a second high-side control signal HON2 to the high-side driving circuit HDR. The charge pump CHP outputs a charging signal to the high-side driving circuit HDR.

When the high-side driving circuit HDR receives the second high-side control signal HON2 from the control circuit COT, the high-side driving circuit HDR outputs a second stage high-side driving signal to the control terminal of the high-side switch HS according to the charging signal from the charge pump CHP. As a result, the voltage of the control terminal of the high-side switch HS is pulled up from the first stage voltage to a target voltage. The target voltage is higher than the first stage voltage. For example, the target voltage is a voltage of a target voltage signal VCP shown in FIG. 1.

The charge pump CHP may include one or more capacitors such as but not limited to a first capacitor C1 and a second capacitor C2 as shown in FIG. 1. If necessary, the charge pump CHP may further include one or more switch components such as but not limited to a first switch component SW1, a second switch component SW2, a third switch component SW3 and a fourth switch component SW4 as shown in FIG. 1.

A first terminal of the first switch component SW1 may be connected to the input power source. The first terminal of the first switch component SW1 may receive the first input voltage signal VM from the input power source. A second terminal of the first switch component SW1 may be connected to the first terminal of the second capacitor C2. A second terminal of the second capacitor C2 may be connected to a first terminal of the second switch component SW2.

A second terminal of the second switch component SW2 may be connected to a first terminal of the first capacitor C1. A second terminal of the first capacitor C1 may be grounded. The first terminal of the first capacitor C1 and the second terminal of the second switch component SW2 may be connected to an input terminal of the high-side driving circuit HDR.

A first terminal of the third switch component SW3 may be connected to the input power source, and may receive the first input voltage signal VM from the input power source. A second terminal of the third switch component SW3 is connected to the second terminal of the second capacitor C2. A first terminal of the second capacitor C2 is connected to a first terminal of the fourth switch component SW4. A second terminal of the fourth switch component SW4 is coupled to a reference voltage Vref.

For example, a voltage difference between the first stage voltage (such as the voltage of the first input voltage signal VM as shown in FIG. 1) and the target voltage (such as the voltage of the target voltage signal VCP as shown in FIG. 1) is a pulled voltage (such as a voltage of a pulled voltage signal VP as shown in FIG. 1). The reference voltage Vref may be equal to the voltage of the first input voltage signal VM from which the pulled voltage such as 5V is subtracted, but the present disclosure is not limited thereto.

It should be understood that, in the charge pump CHP, a voltage of the first capacitor C1 is affected by switching of the first switch component SW1, the second switch component SW2, the third switch component SW3 and the fourth switch component SW4. A voltage of the charging signal that is outputted to the high-side driving circuit HDR by the charge pump CHP depends on the voltage of the first capacitor C1.

It is worth noting that, in the power converter of the present disclosure, the voltage of the control terminal of the high-side switch HS is pulled up to the first stage voltage (from the zero voltage), according to the first high-side control signal HON1 (and the first input voltage signal VM), by the high-side driving circuit HDR. Then, the voltage of the control terminal of the high-side switch HS is pulled up to the target voltage (such as the voltage of the target voltage signal VCP) from the first stage voltage (such as the voltage of the first input voltage signal VM) instead of the zero voltage, by the charging signal outputted by the charge pump CHP. Therefore, the charge pump CHP of the power converter of the present disclosure only need to include capacitors (such as the first capacitor C1 and the second capacitor C2) having small capacitances, thereby efficiently reducing a space occupied by the capacitors of the charge pump CHP in the power converter of the present disclosure.

When the control circuit COT controls the high-side driving circuit HDR to turn on or off the high-side switch HS, the control circuit COT may output a low-side control signal LSCT to low-side driving circuit LDR according to a low-side enable signal LSEN from the external enabling circuit. The low-side driving circuit LDR may, according to the low-side control signal LSCT, output a low-side driving signal to the control terminal of the low-side switch LS to turn on or off the low-side switch LS.

Figure 2:
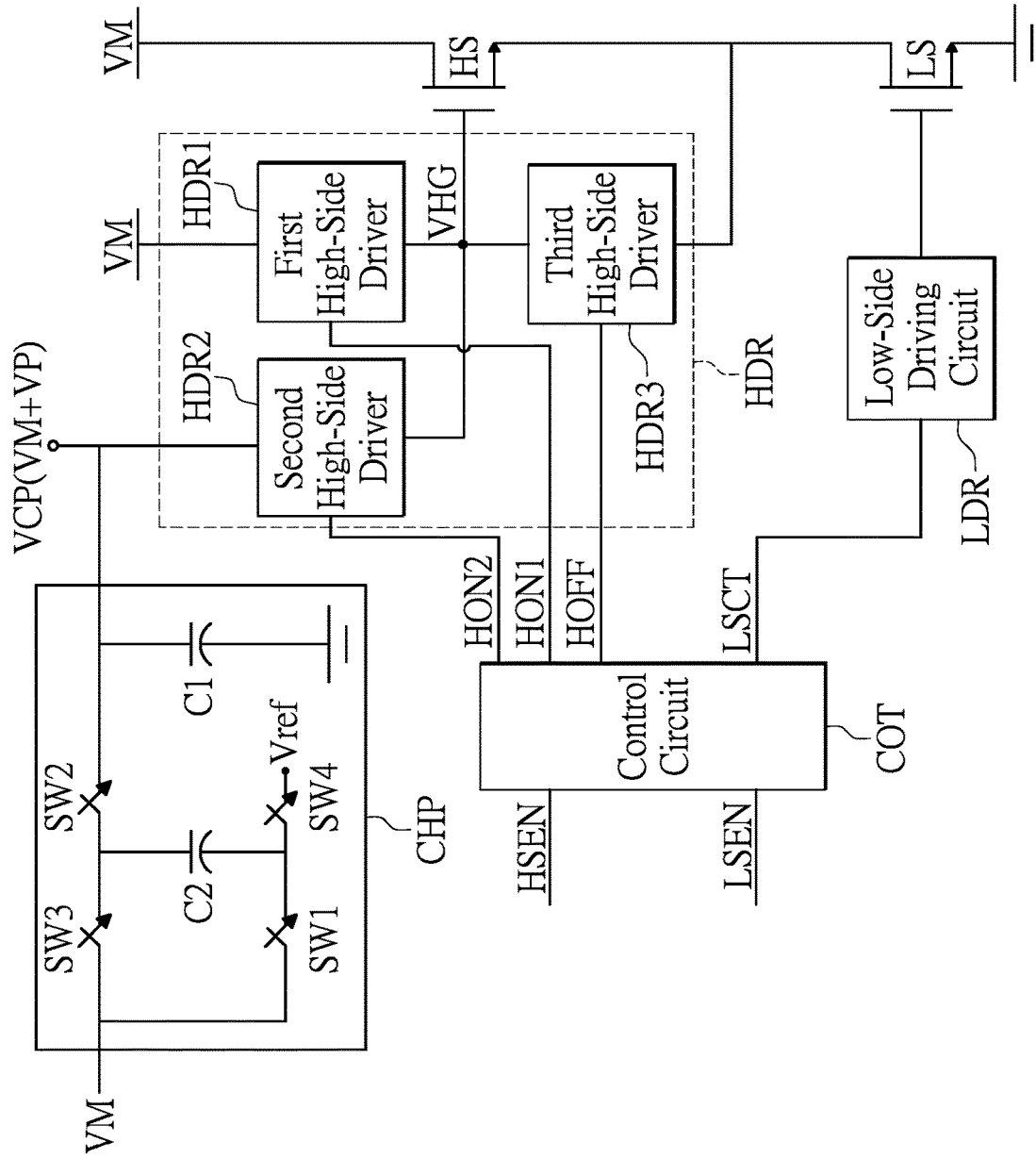
FIG. 2 is a block diagram of a power converter having a multi-stage high-side driving mechanism according to a second embodiment of the present disclosure.

Reference is made to FIG. 2, which is a block diagram of a power converter having a multi-stage high-side driving mechanism according to a second embodiment of the present disclosure. The same descriptions of the first and second embodiments are not repeated herein.

As shown in FIG. 2, in the embodiment, the high-side driving circuit HDR may include a first high-side driver HDR1 and a second high-side driver HDR2. If necessary, the high-side driving circuit HDR may further include a third high-side driver HDR3 as shown in FIG. 2.

The first high-side driver HDR1 is connected to the input power source, and may receive the first input voltage signal VM from the input power source. In addition, the first high-side driver HDR1 is connected to the control terminal of the high-side switch HS and the control circuit COT.

The second high-side driver HDR2 is connected to the control terminal of the high-side switch HS, the control circuit COT, and (the first terminal of the first capacitor C1 of) the charge pump CHP.

The third high-side driver HDR3 is connected to the control terminal of the high-side switch HS, the second terminal of the high-side switch HS and the control circuit COT.

It is worth noting that, the high-side driving circuit HDR, according to the first input voltage signal VM and the first high-side control signal HON1 from the control circuit COT, outputs the first stage high-side driving signal to the control terminal of the high-side switch HS. As a result, the voltage of the control terminal of the high-side switch HS is pulled up to the first stage voltage from the zero voltage. For example, the first stage voltage is equal to the voltage of the first input voltage signal VM.

Then, the second high-side driver HDR2, according to the second high-side control signal HON2 from the control circuit COT and the charging signal from the charge pump CHP (such as a voltage signal of the first capacitor C1 of the charge pump CHP, outputs the second stage high-side driving signal to the control terminal of the high-side switch HS. As a result, the voltage of the control terminal of the high-side switch HS is pulled from the first stage voltage to the target voltage. For example, the target voltage is equal to the voltage of the target voltage signal VCP.

When the high-side switch HS is turned on by the first high-side driver HDR1 and the second high-side driver HDR2, the third high-side driver HDR3 may output a third high-side driving signal to the control terminal and the second terminal of the high-side switch HS to turn off the high-side switch HS according to a third high-side control signal HOFF from the control circuit COT.

Figure 3:
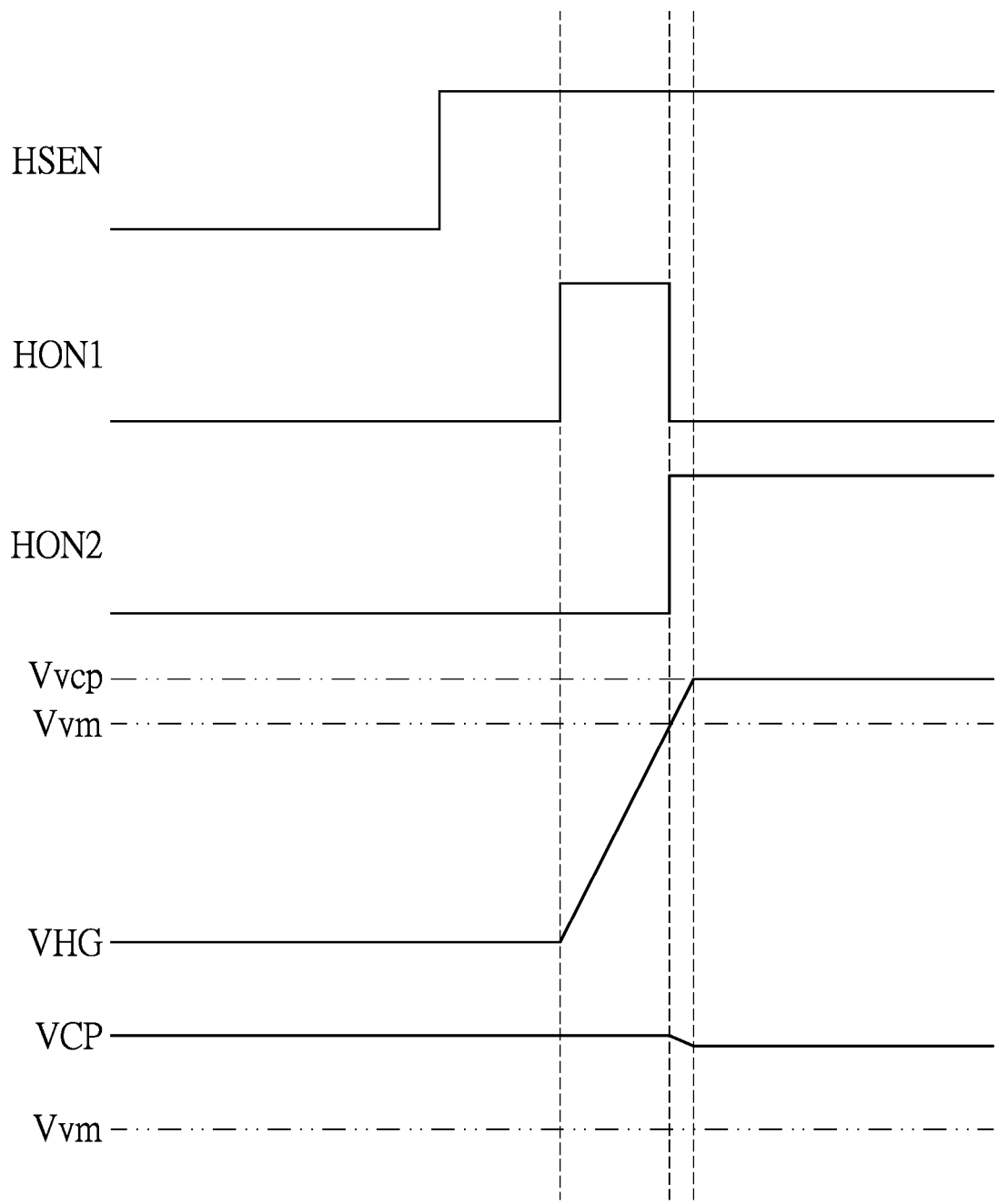
FIG. 3 is a waveform diagram of signals of the power converter having the multi-stage high-side driving mechanism according to the second embodiment of the present disclosure.
Figure 4:
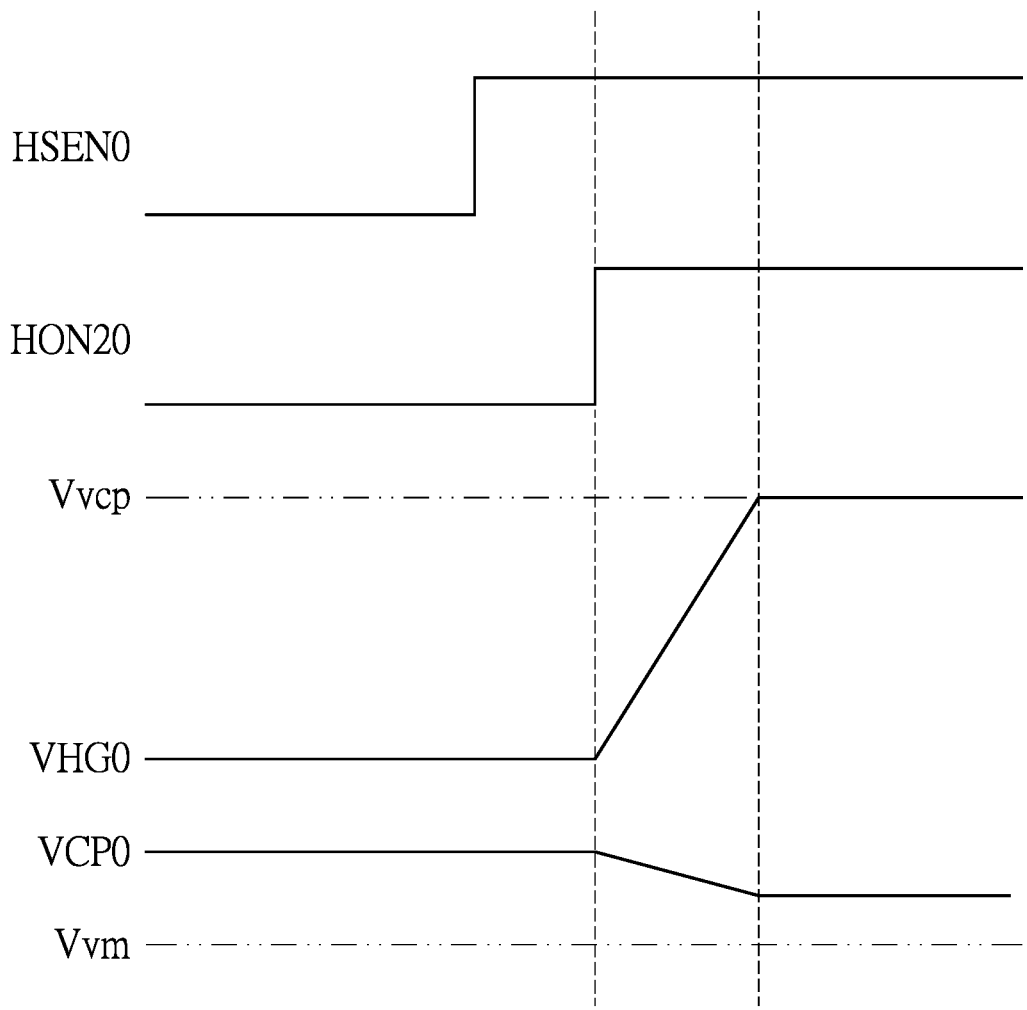
FIG. 4 is a waveform diagram of signals of a conventional power converter.

Reference is made to FIGS. 2 to 4, in which FIG. 3 is a waveform diagram of signals of the power converter having the multi-stage high-side driving mechanism according to the second embodiment of the present disclosure, and FIG. 4 is a waveform diagram of signals of a conventional power converter.

As shown in FIGS. 2 and 3, the control circuit COT of the power converter of the present disclosure is enabled to output the first high-side control signal HON1 at a high level by the high-side enable signal HSEN. Under this condition, the first high-side driver HDR1, according to the high level of the first high-side control signal HON1, pulls up a voltage of a high-side voltage controlled signal VHG of the control terminal of the high-side switch HS to the first stage voltage from the zero voltage. For example, the first stage voltage is equal to the voltage of the first input voltage signal VM that is represented by a first input voltage Vvm as shown in FIG. 3.

Then, the second high-side driver HDR2 of the power converter of the present disclosure, according to a high level of the second high-side control signal HON2 from the control circuit COT, pulls up the voltage of the high-side voltage controlled signal VHG of the control terminal of the high-side switch HS from the first stage voltage (that is equal to the first input voltage Vvm) to a target voltage Vvcp as shown in FIG. 3.

That is, in the power converter of the present disclosure, the high-side driving circuit HDR pulls up the voltage of the control terminal of the high-side switch HS to the first stage voltage from the zero voltage by using the first input voltage signal VM from the input power source. Then, the high-side driving circuit HDR pulls up the voltage of the control terminal of the high-side switch HS from the first stage voltage to the target voltage Vvcp via the charge pump CHP. Therefore, the charge pump CHP of the present disclosure only includes the capacitors (such as the first capacitor C1 and the second capacitor C2) having the small capacitances, thereby efficiently reducing the space occupied by the capacitors of the charge pump CHP in the power converter of the present disclosure.

In contrast, in the conventional power converter, when a control circuit is enabled to output a high-side control signal HON20 at a high level by a high-side enabling signal HSEN0, a charge pump directly pulls up a voltage of a high-side voltage controlled signal VHG0 of a control terminal of a high-side switch from the zero voltage to the target voltage Vvcp.

When the high-side control signal HON20 is at the high level, the high-side switch of the conventional power converter is turned on. At this time, the voltage of the control terminal of the high-side switch drops significantly, which is represented by a high-side voltage controlled signal VCP0 as shown in FIG. 4. Therefore, the charge pump of the conventional power converter must include capacitors having large capacitances configured to pull up the voltage of the control terminal of the high-side switch from the zero voltage to the target voltage Vvcp. However, the capacitors having the large capacitances occupy a large space in the conventional power converter.

Beneficial Effects of the Embodiments

In conclusion, the present disclosure provides the power converter having the multi-stage high-side driving mechanism. In the power converter of the present disclosure, the high-side driving circuit pulls up the voltage of the control terminal of the high-side switch from the zero voltage to the first stage voltage by using the first input voltage signal. Then, the high-side driving circuit pulls up the voltage of the control terminal of the high-side switch from the first stage voltage to the target voltage via the charge pump. As a result, the high-side switch is turned on and driven to operate normally.

That is, the charge pump of the power converter of the present disclosure does not pull up the voltage of the control terminal of the high-side switch directly from the zero voltage to the target voltage. Therefore, the charge pump of the power converter of the present disclosure only includes the capacitors having the small capacitances, thereby efficiently reducing the space occupied by the capacitors of the charge pump in the power converter.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a multi-stage high-side driving mechanism, comprising:
    a high-side switch, wherein a first terminal of the high-side switch is connected to an input power source and configured to receive a first input voltage signal from the input power source;
    a low-side switch, wherein a first terminal of the low-side switch is connected to a second terminal of the high-side switch, and a second terminal of the low-side switch is grounded;
    a charge pump configured to output a charging signal;
    a control circuit configured to output a first high-side control signal, a second high-side control signal and a low-side control signal;

a low-side driving circuit connected to a control terminal of the low-side switch and the control circuit, and configured to output a low-side driving signal to the control terminal of the low-side switch according to the low-side control signal; and a high-side driving circuit connected to a control terminal of the high-side switch, the charge pump and the control circuit;

wherein the high-side driving circuit, according to the first high-side control signal, outputs a first stage high-side driving signal to the control terminal of the high-side switch to pull up a voltage of the control terminal of the high-side switch to a first stage voltage;

wherein, after the voltage of the control terminal of the high-side switch is pulled up to the first stage voltage, the high-side driving circuit, according to the second high-side control signal and the charging signal, outputs a second stage high-side driving signal to the control terminal of the high-side switch to pull up the voltage of the control terminal of the high-side switch from the first stage voltage to a target voltage;

wherein the first stage voltage is equal to a voltage of the first input voltage signal.

2. The power converter according to claim 1, wherein the high-side driving circuit includes:

a first high-side driver connected to the control terminal of the high-side switch and the control circuit, wherein the first high-side driver, according to the first high-side control signal, outputs the first stage high-side driving signal to the control terminal of the high-side switch to pull up the voltage of the control terminal of the high-side switch to the first stage voltage; and a second high-side driver connected to the control terminal of the high-side switch, the charge pump and the control circuit, wherein, after the voltage of the control terminal of the high-side switch is pulled up to the first stage voltage, the high-side driving circuit, according to the second high-side control signal and the charging signal, outputs the second stage high-side driving signal to the control terminal of the high-side switch to pull up the voltage of the control terminal of the high-side switch from the first stage voltage to the target voltage.

3. The power converter according to claim 2, wherein the high-side driving circuit further includes:

a third high-side driver connected to the control terminal of the high-side switch, the second terminal of the high-side switch and the control circuit, wherein the third high-side driver, according to a third high-side control signal from the control circuit, outputs a third high-side driving signal to the control terminal and the second terminal of the high-side switch to turn off the high-side switch.

4. The power converter according to claim 2, wherein the first high-side driver is connected to the input power source and configured to receive the first input voltage signal from the input power source;

wherein, when the first high-side driver receives the first high-side control signal, the first high-side driver pulls up the voltage of the control terminal of the high-side switch to the first stage voltage according to the first input voltage signal.

5. The power converter according to claim 1, wherein the charge pump is connected to the input power source and configured to receive the first input voltage signal from the input power source.

6. The power converter according to claim 1, wherein the charge pump includes:

a first capacitor, wherein a first terminal of the first capacitor is connected to the input power source and configured to receive the first input voltage signal from the input power source, the first terminal of the first capacitor is further connected to the high-side driving circuit, and a second terminal of the first capacitor is grounded.

7. The power converter according to claim 6, wherein the charge pump further includes:

a second capacitor, wherein a first terminal of the second capacitor is connected to the input power source and configured to receive the first input voltage signal from the input power source, and a second terminal of the second capacitor is connected to the first terminal of the first capacitor.

8. The power converter according to claim 7, wherein the charge pump further includes:

a first switch component, wherein a first terminal of the first switch component is connected to the input power source and configured to receive the first input voltage signal from the input power source, and a second terminal of the first switch component is connected to the first terminal of the second capacitor.

9. The power converter according to claim 8, wherein the charge pump further includes:

a second switch component, wherein a first terminal of the second switch component is connected to the second terminal of the second capacitor, and a second terminal of the second switch component is connected to the first terminal of the first capacitor.

10. The power converter according to claim 9, wherein the charge pump further includes:

a third switch component, wherein a first terminal of the third switch component is connected to the input power source and configured to receive the first input voltage signal from the input power source, and a second terminal of the third switch component is connected to the second terminal of the second capacitor.

11. The power converter according to claim 10, wherein the charge pump further includes:

a fourth switch component, wherein a first terminal of the fourth switch component is connected to the first terminal of the second capacitor, and a second terminal of the fourth switch component is coupled to a reference voltage.

12. The power converter according to claim 11, wherein a voltage difference between the first stage voltage and the target voltage is a pulled voltage, and the reference voltage is equal to the voltage of the first input voltage signal from which the pulled voltage is subtracted.

* * * * *